US008006155B2

(12) United States Patent  
Fernsler et al.

(10) Patent No.: US 8,006,155 B2
(45) Date of Patent: Aug. 23, 2011

(54) TESTING AN OPERATION OF INTEGRATED CIRCUITRY

(75) Inventors: Matthew E. Fernsler, Cedar Park, TX (US); Tilman Gloekler, Gaertringen (DE); Sanjay Gupta, Austin, TX (US); Christopher J. Spandikow, Austin, TX (US); Todd Swanson, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 1219 days.

(21) Appl. No.: 11/621,361

(22) Filed: Jan. 9, 2007

(65) Prior Publication Data

US 2008/0167853 A1 Jul. 10, 2008

(51) Int. Cl.
*G01R 31/28* (2006.01)
(52) U.S. Cl. ........................................ 714/738
(58) Field of Classification Search .......... 714/718, 714/724, 726, 727, 733, 738
See application file for complete search history.

(56) References Cited

U.S. PATENT DOCUMENTS

| | | | |
|---|---|---|---|
| 6,782,499 B2 | 8/2004 | Osada et al. |
| 7,065,726 B1 | 6/2006 | Singhal et al. |
| 7,093,143 B2 | 8/2006 | Ito et al. |
| 7,141,883 B2 | 11/2006 | Wei et al. |
| 7,161,828 B2 | 1/2007 | Cummings et al. |
| 7,178,078 B2 | 2/2007 | Hiraide et al. |
| 7,213,182 B2 | 5/2007 | Kobayashi |
| 7,315,972 B1 | 1/2008 | Bapat |
| 7,561,999 B2 | 7/2009 | Iwamoto et al. |
| 7,734,973 B2 | 6/2010 | Hiraide et al. |
| 2004/0158788 A1 | 8/2004 | Kaszynski et al. |
| 2006/0071691 A1 | 4/2006 | Garlepp |
| 2008/0221861 A1 | 9/2008 | Yoneda et al. |
| 2008/0270103 A1* | 10/2008 | Kaszynski et al. ............. 703/22 |
| 2008/0288230 A1 | 11/2008 | Fernsler et al. |

OTHER PUBLICATIONS

International Business Machines Corporation, "Method and Means to Execute Verification Testcases/Tasks Using HDL and Achieving Near Emulation Speeds," Mar. 13, 2006, IP.com, Inc.
U.S. Appl. No. 12/130,675, Image File Wrapper printed Feb. 8, 2011, 2 pages.
"Method and Means to Execute Verification Testcases/Tasks Using HDL and Achieving Near Emulation Speeds", International Business Machines Corporation, IP.com, Inc., Mar. 13, 2006, 2 pages.
Applicant Initiated Interview Request Form (PTOL 413-A) and Agenda for Telephone Interview faxed to the USPTO on Mar. 22, 2011 for U.S. Appl. No. 12/130,675, 8 pages.
Interview Summary mailed Apr. 11, 2011 for U.S. Appl. No. 12/130,675; 4 pages.
Notice of Allowance mailed May 19, 2011 for U.S. Appl. No. 12/130,675; 15 pages.
Response to Office Action filed with the USPTO on Mar. 31, 2011 for U.S. Appl. No. 12/130,675, 18 pages.

* cited by examiner

*Primary Examiner* — Cynthia Britt
*Assistant Examiner* — Daniel F McMahon
(74) *Attorney, Agent, or Firm* — Stephen R. Tkacs; Stephen J. Walder, Jr.; Matthew B. Talpis

(57) ABSTRACT

A general purpose computational resource is provided for performing general purpose operations of a system. A special purpose computational resource is coupled to the general purpose computational resource. The special purpose computational resource is provided for: storing test patterns, a description of integrated circuitry, and a description of hardware for testing the integrated circuitry; and executing software for simulating an operation of the described hardware's testing of the described integrated circuitry in response to the test patterns.

14 Claims, 4 Drawing Sheets

TESTING AN OPERATION OF INTEGRATED CIRCUITRY

TECHNICAL FIELD

The disclosures herein relate in general to information handling systems, and in particular to a method and system for testing an operation of integrated circuitry.

BACKGROUND

Testing an operation of integrated circuitry is challenging, because values (e.g., zero logic state "0," one logic state "1" or high impedance state "Z") of the integrated circuitry's internal nodes are difficult to observe. Nevertheless, in very large scale integration ("VLSI") designs of integrated circuitry, such testing is important for identifying defects. Examples are: (a) logical built-in self-tests ("LBISTs"); (b) array built-in self-tests ("ABISTs"); and (c) more complicated tests with design-for-test ("DFT") patterns, which specify various sequences of values to extensively check for possible defects in the integrated circuitry.

The DFT patterns themselves are complex and potentially error-prone. Accordingly, the DFT patterns themselves are subject to validation and debugging, in order to determine their suitability for use in such testing. In one example: (a) the DFT patterns are coded in a C programming language; (b) the integrated circuitry is placed into a board (e.g., AWANNG board or ET4×4 board); (c) the board executes the C program's encoded DFT patterns; and (d) in response to such execution, the board drives values of various inputs (e.g., C4 inputs and/or internal nodes) of the integrated circuitry and reads the resulting values of various outputs (e.g., C4 outputs and/or internal nodes) of the integrated circuitry.

In that manner, the board emulates a hardware environment of the integrated circuitry's operation in response to the DFT patterns. However, in such emulation, the board frequently interrupts its execution of the DFT patterns (e.g., after each simulation cycle), in order to: (a) drive values of the various inputs; and (b) measure resulting values of the various outputs. With such frequent interruptions, a speed and efficiency of such testing is significantly reduced, especially if the board executes the DFT patterns during millions of simulation cycles, and especially if some of the DFT patterns are incompletely validated and/or incompletely debugged before such testing.

A need has arisen for a method and system for testing an operation of integrated circuitry, in which various shortcomings of previous techniques are overcome. For example, a need has arisen for a method and system for testing an operation of integrated circuitry, in which an operation of integrated circuitry is tested with higher speed and higher efficiency.

SUMMARY

A general purpose computational resource is provided for performing general purpose operations of a system. A special purpose computational resource is coupled to the general purpose computational resource. The special purpose computational resource is provided for: storing test patterns, a description of integrated circuitry, and a description of hardware for testing the integrated circuitry; and executing software for simulating an operation of the described hardware's testing of the described integrated circuitry in response to the test patterns A principal advantage of this embodiment is that various shortcomings of previous techniques are overcome. For example, a principal advantage of this embodiment is that an operation of integrated circuitry is tested with higher speed and higher efficiency.

DETAILED DESCRIPTION

Figure 1:
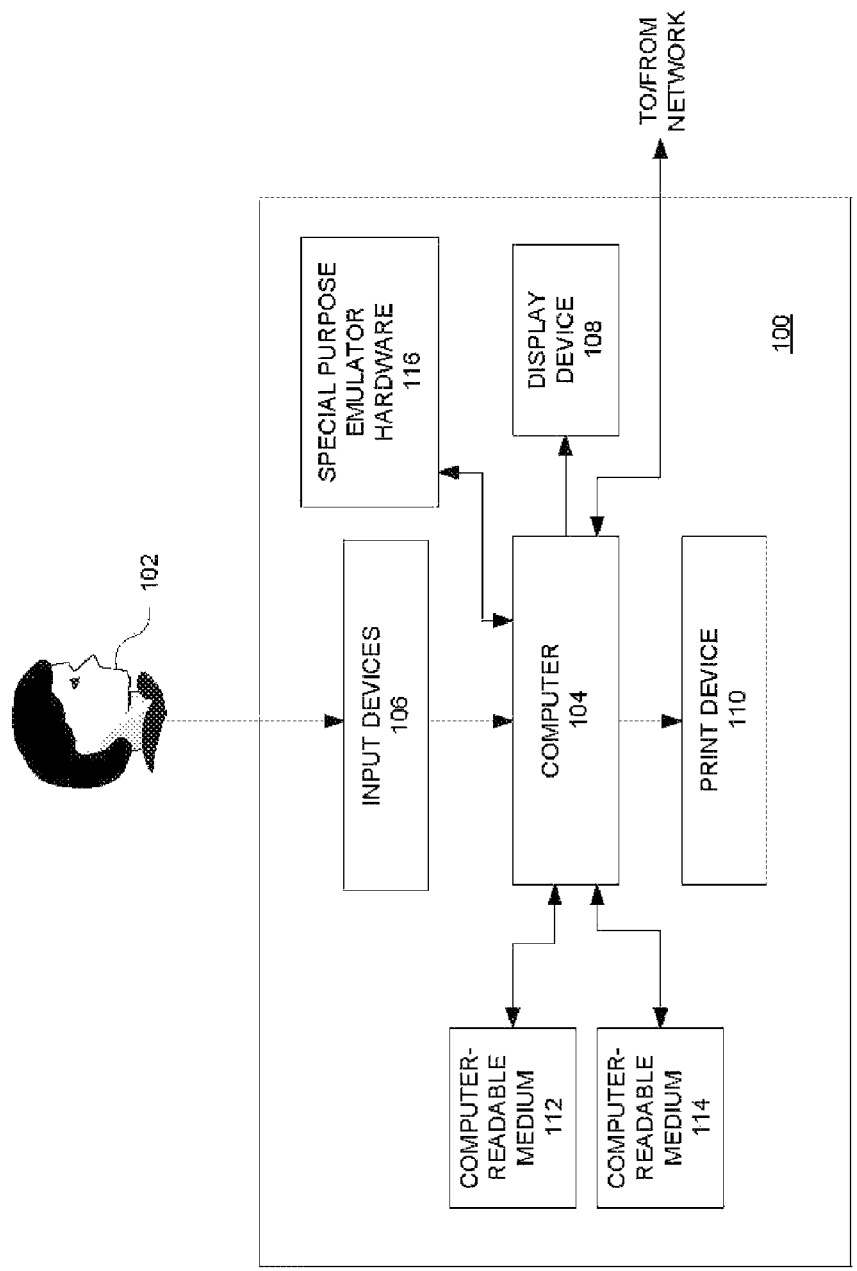
FIG. 1 is a block diagram of a representative computing system, according to the illustrative embodiment.

FIG. 1 is a block diagram of a representative information handling system ("IHS") 100, according to the illustrative embodiment. In the example of FIG. 1, the IHS 100 operates in association with a human user 102. The IHS 100 is formed by various electronic circuitry components, including: (a) a general purpose computer 104, which is a general purpose computational resource such as a workstation or server, for executing and otherwise processing instructions, and for performing additional operations (e.g., communicating information) in response thereto, as discussed further hereinbelow; (b) input devices 106 for receiving information from the user 102; (c) a display device 108 (e.g., a conventional flat panel monitor) for displaying information to the user 102; (d) a print device 110 (e.g., a conventional electronic printer or plotter) for printing visual images on paper; (e) a computer-readable medium (or apparatus) 112 (e.g., a hard disk drive or other nonvolatile storage device) for storing information; (f) a portable computer-readable medium (or apparatus) 114 (e.g., a removable flash memory card or CD-ROM) for storing information; (g) special purpose emulator hardware 116, which is a special purpose computational resource for simulating operations of integrated circuitry and other hardware, as discussed further hereinbelow in connection with FIGS. 2-4; and (h) various other electronic circuitry for performing other operations of the IHS 100.

For example, the computer 104 includes: (a) a network interface (e.g., circuitry) for communicating between the computer 104 and a network (e.g., outputting information to, and receiving information from, the network), such as by transferring information (e.g. instructions, data, signals) between the computer 104 and the network; and (b) a memory device (e.g., random access memory ("RAM") device and/or read only memory ("ROM") device) for storing information (e.g., instructions of software executed by the computer 104, and data processed by the computer 104 in response to such instructions). Accordingly, in the example of FIG. 1, the computer 104 is connected to a network, the input devices 106, the display device 108, the print device 110, the computer-readable medium 112, the computer-readable medium 114, and the special purpose emulator hardware 116, as shown in FIG. 1. The computer 104 executes: (a) operating system software (e.g., LINUX operating system software) for performing general purpose tasks; and (b) other processes and applications.

In response to signals from the computer 104, the display device 108 displays visual images, which represent information, and the user 102 views such visual images. Moreover, the user 102 operates the input devices 106 to output information to the computer 104, and the computer 104 receives such information from the input devices 106. Also, in response to signals from the computer 104, the print device 110 prints visual images on paper, and the user 102 views such visual images.

The input devices 106 include, for example, a conventional electronic keyboard (or keypad) and a pointing device, such as a conventional electronic "mouse," rollerball or light pen. The user 102 operates the keyboard (or keypad) to output alphanumeric text information to the computer 104, which receives such alphanumeric text information. The user 102 operates the pointing device to output cursor-control information to the computer 104, and the computer 104 receives such cursor-control information. The input devices 106 also include, for example, touch-sensitive circuitry of a liquid crystal display ("LCD") device.

Figure 2:
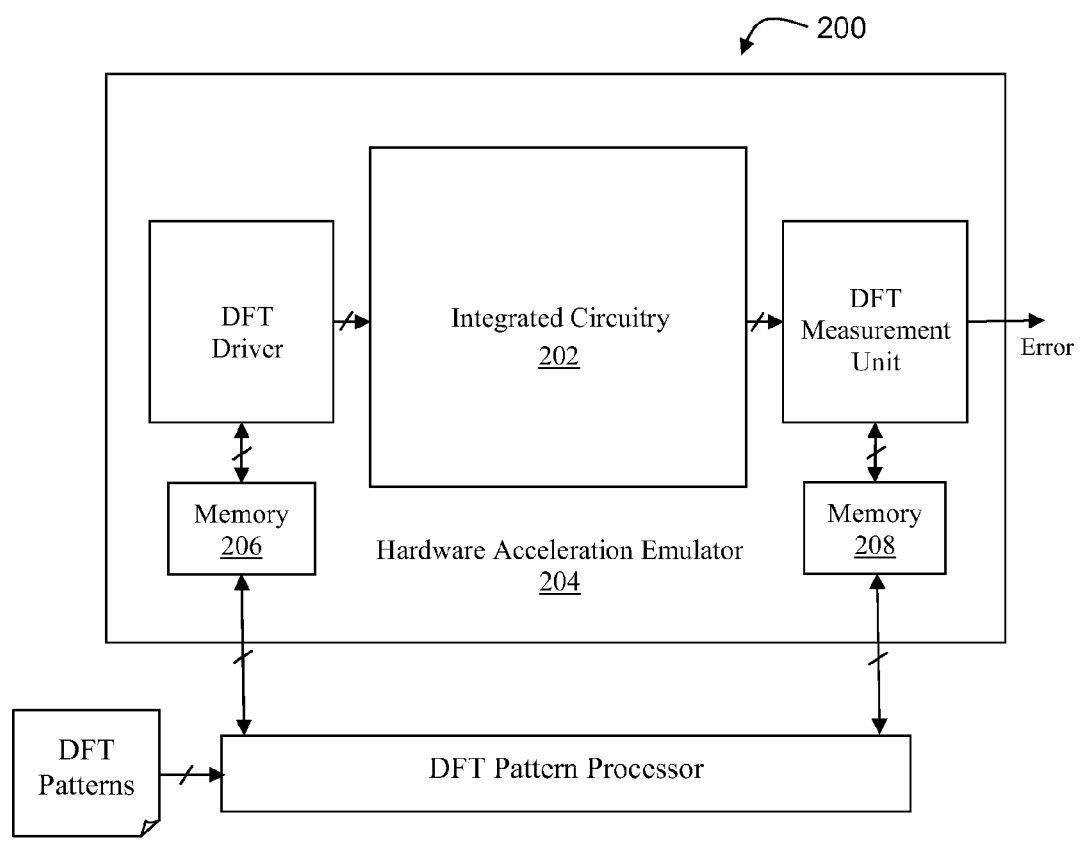
FIG. 2 is a block diagram of hardware for testing integrated circuitry in response to various design-for-test ("DFT") patterns.

FIG. 2 is a block diagram of design-for-test ("DFT") hardware, indicated generally at 200, for testing integrated circuitry 202 in response to various DFT patterns. Such DFT patterns specify various sequences of values to extensively check for possible defects in the integrated circuitry 202. In one example, such DFT patterns specify complete power-on-reset ("POR") sequences, complex system operations, and/or heavy workloads.

Referring again to FIG. 1, the special purpose emulator hardware 116 stores such DFT patterns (e.g., coded in a C programming language). The special purpose emulator hardware 116 receives such DFT patterns from the computer 104, and the computer 104 is likewise operable to read such DFT patterns from the special purpose emulator hardware 116 (e.g., if such DFT patterns are modified by the special purpose emulator hardware 116). The user 102 is able to view (e.g., through the display device 108) and/or specify (e.g., through the computer-readable medium 114, through the network, and/or through the input devices 106) such DFT patterns by outputting suitable commands to the computer 104 through the input devices 106.

Also, the special purpose emulator hardware 116 stores a register-transfer level description ("RTL"), such as a VERILOG description or VHDL description, of: (a) the hardware 200; and (b) the integrated circuitry 202. The special purpose emulator hardware 116 receives such RTL from the computer 104, and the computer 104 is likewise operable to read such RTL from the special purpose emulator hardware 116. The user 102 is able to view and/or specify such RTL by outputting suitable commands to the computer 104 through the input devices 106.

In response to such RTL (of the hardware 200 and the integrated circuitry 202), the special purpose emulator hardware 116 (e.g., a hardware acceleration emulator board) executes software for simulating operations (which are described by such RTL) of: (a) the integrated circuitry 202; and (b) the hardware 200 testing of the integrated circuitry 202 in response to such DFT patterns. In that manner, the special purpose emulator hardware 116 supports validation and debugging of such DFT patterns, with higher speed and higher efficiency.

In an alternative embodiment, the system 100 does not include the special purpose emulator hardware 116. In such an alternative embodiment, the general purpose computer 104 executes the software for simulating the operations (which are described by such RTL) of: (a) the integrated circuitry 202; and (b) the hardware 200 testing of the integrated circuitry 202 in response to such DFT patterns. Such an alternative embodiment has a shortcoming, because: (a) the general purpose computer 104 also performs general purpose tasks and executes other processes and applications, which variously interrupt the general purpose computer 104 during its execution of the software; and (b) accordingly, in comparison to the special purpose emulator hardware 116, the general purpose computer 104 performs such execution of the software with lower speed and lower efficiency.

In another alternative embodiment, the system 100 includes the special purpose emulator hardware 116, which: (a) executes the software for simulating the operations of the integrated circuitry 202; but (b) does not execute the software for simulating the operations of the hardware 200. Instead, in such an alternative embodiment, the general purpose computer 104 executes the software for simulating the operations of the hardware 200. Such an alternative embodiment has a shortcoming, because: (a) the general purpose computer 104 also performs general purpose tasks and executes other processes and applications, which variously interrupt the general purpose computer 104 during its execution of the software; and (b) accordingly, in comparison to the special purpose emulator hardware 116, the general purpose computer 104 performs such execution of the software with lower speed and lower efficiency. Moreover, because the general purpose computer 104 performs such execution (of the software for simulating the operations of the hardware 200) in such an alternative embodiment, the general purpose computer 104 engages in a higher amount of communication with the special purpose emulator hardware 116 during such execution, so that: (a) the special purpose emulator hardware 116 is interrupted on a more frequent basis during its execution (of the software for simulating the operations of the integrated circuitry 202); and (b) accordingly, the special purpose emulator hardware 116 performs its execution with lower speed and lower efficiency.

Referring again to FIG. 2, the hardware 200 includes a hardware acceleration emulator 204, into which the integrated circuitry 202 is placed. As discussed hereinabove, in response to RTL of the hardware 200 and RTL of the integrated circuitry 202, the special purpose emulator hardware 116 executes software for simulating operations (which are described by such RTL) of: (a) the integrated circuitry 202; and (b) the hardware 200 testing of the integrated circuitry 202 in response to DFT patterns that are stored by the special purpose emulator hardware 116.

As shown in FIG. 2, the hardware acceleration emulator 204 includes: (a) a DFT driver, which is connected to various inputs (e.g., C4 inputs and/or internal nodes) of the integrated circuitry 202; (b) a DFT measurement unit, which is connected to various outputs (e.g., C4 outputs and/or internal nodes) of the integrated circuitry 202; (c) a memory 206; and (d) a memory 208. In one embodiment, the memory 206 and the memory 208 are unified as a single memory.

Also, the hardware 200 includes a DFT pattern processor. The memory 206 is coupled between the DFT pattern processor and the DFT driver. The memory 208 is coupled between the DFT pattern processor and the DFT measurement unit. As shown in FIG. 2, the DFT pattern processor receives the DFT patterns, which specify various sequences of values to extensively check for possible defects in the integrated circuitry 202.

To reduce the size of memory 206 and memory 208, the DFT pattern processor: (a) compresses the DFT patterns; (b) outputs first portions of the compressed DFT patterns to the memory 206 for storage; and (c) outputs second portions of the compressed DFT patterns to the memory 208 for storage. The DFT driver: (a) reads and decompresses the first portions from the memory 206; and (b) in response to the decompressed first portions, drives values of various inputs of the integrated circuitry 202. In one embodiment, the special purpose emulator hardware 116 includes dedicated hardware and/or dedicated software for performing the compression and/or decompression of DFT patterns.

In response to such driving, the DFT measurement unit: (a) reads values of various outputs of the integrated circuitry 202 ("measured values"); (b) reads and decompresses the second portions from the memory 208; (c) in response to the decompressed second portions, determines values ("expected values") that the second portions specify as being respectively associated with the measured values; and (d) compares the expected values with their respectively associated measured values. In response to such comparison, if the DFT measurement unit determines that one or more of the measured values are different from their respectively associated expected values, the DFT measurement unit: (a) outputs an error signal, as shown in FIG. 2; (b) modifies the second portions to identify the one or more expected values that are different from their respectively associated measured values; (c) compresses the modified second portions; (d) outputs the compressed modified second portions to the memory 208 for storage; and (e) in a particular mode of operation, automatically stops performing its simulation/emulation activity.

In that manner, the hardware 200 emulates a hardware environment of the integrated circuitry 202 operation in response to the DFT patterns. During or after such emulation, the DFT pattern processor is operable (e.g., in response to commands from the user 102 via the input devices 106) to: (a) read and decompress the modified second portions from the memory 208; and (b) output the modified second portions for display to a human user (e.g., via the display device 108 of FIG. 1), so that the human user (e.g., human user 102 of FIG. 1) may identify the one or more expected values that are different from their respectively associated measured values. In response to such identification, the computer 104 (or the human user) may revise the DFT patterns to eliminate such difference. In that manner, the DFT patterns are validated and debugged, so that the DFT patterns are more suitable for use in subsequently testing an operation of the integrated circuitry 202 when the actual integrated circuitry 202 is physically placed into the actual hardware acceleration emulator 204 (e.g., AWANNG board or ET4×4 board) for such testing.

In one embodiment, the actual hardware acceleration emulator 204 includes dedicated hardware and/or dedicated software for performing the compression and/or decompression of DFT patterns. In the illustrative embodiment, the compression and decompression techniques (e.g., run length encoding and decoding) are carefully selected to enhance such performance, according to predominant characteristics of the DFT patterns. Moreover, in one embodiment, all or part of such performance is subject to being automatically suspended by the special purpose emulator hardware 116 and/or the actual hardware acceleration emulator 204, to the extent that suspension is likely to avoid a substantial inefficiency that would have otherwise resulted from such performance.

Figure 3:
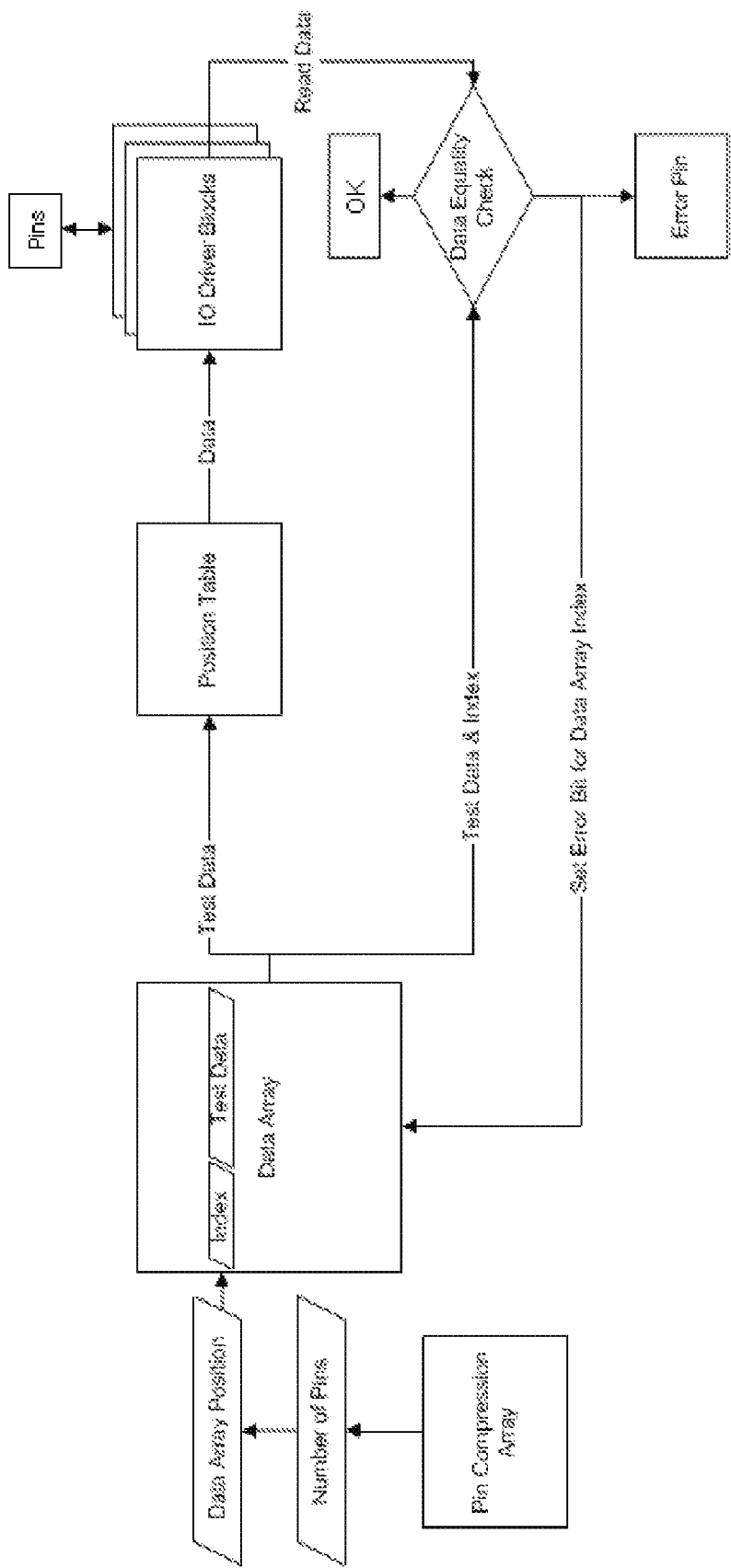
FIG. 3 is an information flow diagram of the hardware of FIG. 2.

FIG. 3 is an information flow diagram of the hardware 200. In FIG. 3, the memory 206 and memory 208 store the DFT patterns as a sequence of records (shown by "data array" in FIG. 3). Also, the DFT patterns include information (shown by "pin compression array" in FIG. 3) that, per simulation cycle of the integrated circuitry 202, specifies a respective number N (shown by "number of pins" in FIG. 3) of inputs and outputs (shown by "pins" in FIG. 3) of the integrated circuitry 202 that are specified to potentially change during the simulation cycle. For each of the N pins that is specified to change during the simulation cycle, the DFT patterns include information (shown by "data array position" in FIG. 3) that specifies a respective index (shown by "index" in FIG. 3), which accesses such pin's respective test data in the data array.

If such pin is an input of the integrated circuitry 202, such pin's respective test data specify a value (e.g., zero logic state "0," one logic state "1" or high impedance state "Z") for the DFT driver to drive such input. If such pin is an output of the integrated circuitry 202, such pin's respective test data specify the expected value of such output. If such pin is high impedance, such pin's respective test data specify high impedance.

Also, such pin's respective test data include the following fields: (a) Address, which identifies such pin's respective number among all pins of the integrated circuitry 202; (b) Valid, which identifies whether such pin is valid or instead "don't care"; (c) Mode, which identifies whether such pin is an input of the integrated circuitry 202, an output of the integrated circuitry 202, or instead high impedance; (d) Clock, which indicates whether (in lieu of a single value) the DFT driver is specified to drive such pin with an oscillating clock signal at a particular pattern that repeats automatically; if so, the Clock field specifies a code, and the DFT driver generates the oscillating clock signal in response to the specified code; and (e) Error, which indicates whether execution (by the hardware acceleration emulator 204) of a DFT pattern (specifying such pin) resulted in a measured value that is different from its respectively associated expected value.

As shown in FIG. 3, per simulation cycle of the integrated circuitry 202, a position table of the hardware acceleration emulator 204 specifies the respective values of all pins (of the integrated circuitry 202) that are directly connected to either the DFT driver or DFT measurement unit. For each such pin, its respective value is either: (a) specified by such pin's respective test data, as discussed hereinabove; or (b) high impedance. In response to the respective values (shown by "data" in FIG. 3) in the position table, the DFT driver (shown by "IO driver blocks" in FIG. 3) drives the respective values of such pins.

As discussed hereinabove in connection with FIG. 2, in response to such driving, the DFT measurement unit: (a) reads the measured values (shown by "read data" in FIG. 3); (b) reads and decompresses portions (shown by "test data & index" in FIG. 3) of the DFT patterns from the memory 208; (c) in response to such decompressed portions, determines values ("expected values") that such decompressed portions specify as being respectively associated with the measured values; and (d) compares the expected values with their respectively associated measured values (shown by "data equality check" in FIG. 3). In response to such comparison, if the DFT measurement unit determines that one or more of the measured values are different from their respectively associated expected values, the DFT measurement unit: (a) outputs an error signal (shown by "error pin" in FIG. 3), which the DFT measurement unit continues to latch during the following simulation cycles; and (b) for any pins whose one or more expected values are different from their respectively associated measured values, modifies such pins' respective test data (identified by a respective index, as discussed hereinabove) in the data array to identify such difference (shown by "set error bit for data array index" in FIG. 3). Conversely, if the DFT measurement unit determines that the measured values are the same as their respectively associated expected values, the DFT measurement unit outputs a verification signal (shown by "OK" in FIG. 3).

In a first alternative embodiment, the number N (of pins that are specified to potentially change) is constant for all simulation cycles of the integrated circuitry 202, so that: (a)

the pin compression array and number of pins features of FIG. 3 are removed; and (b) the Valid field is removed from the test data within the data array, because the hardware acceleration emulator 204 operates with all of the N bits being valid. Such an alternative embodiment is more efficient in various situations, such as if a relatively high percentage of pins of the integrated circuitry 202 are specified to change during a relatively high percentage of the simulation cycles.

In a second alternative embodiment, the pin compression array includes a flag that the hardware acceleration emulator 204 either sets or clears (per one or more simulation cycles of the integrated circuitry 202) to selectively enter a mode of operation in which the number N is constant for multiple (2 or more) successive simulation cycles of the integrated circuitry 202. For such multiple successive simulation cycles, the hardware acceleration emulator 204: (a) bypasses the pin compression array and number of pins features of FIG. 3; and (b) ignores the Valid field from the test data within the data array, because the hardware acceleration emulator 204 operates with all of the N bits being valid. In one example, the hardware acceleration emulator 204 either sets or clears such flag automatically, in response to a calculation (by the hardware acceleration emulator 204) that determines whether operating in such mode will make the hardware acceleration emulator 204 operations more efficient, such as by factoring a percentage of pins of the integrated circuitry 202 that are specified (by the DFT patterns) to change during a percentage of such multiple successive simulation cycles. In another example, the hardware acceleration emulator 204 either sets or clears such flag in response to manual coding of the DFT patterns.

In a third alternative embodiment, the respective test data for all input pins are grouped into a first set within the data array, and the respective test data for all output pins are grouped into a second set within the data array. In such an alternative embodiment, the Mode field is removed from the test data within the data array, because the hardware acceleration emulator 204 operates in reliance on the respective test data being so grouped into such first and second sets.

In a fourth alternative embodiment, the hardware acceleration emulator 204 includes a flag that the hardware acceleration emulator 204 either sets or clears (per one or more simulation cycles of the integrated circuitry 202) to selectively enter a mode of operation in which the respective test data are so grouped into such first and second sets for multiple (2 or more) successive simulation cycles of the integrated circuitry 202. For such multiple successive simulation cycles, the hardware acceleration emulator 204 ignores the Mode field from the test data within the data array. In one example, the hardware acceleration emulator 204 either sets or clears such flag automatically, in response to a calculation (by the hardware acceleration emulator 204) that determines whether operating in such mode will make the hardware acceleration emulator 204 operations more efficient. In another example, the hardware acceleration emulator 204 either sets or clears such flag in response to manual coding of the DFT patterns.

Figure 4:
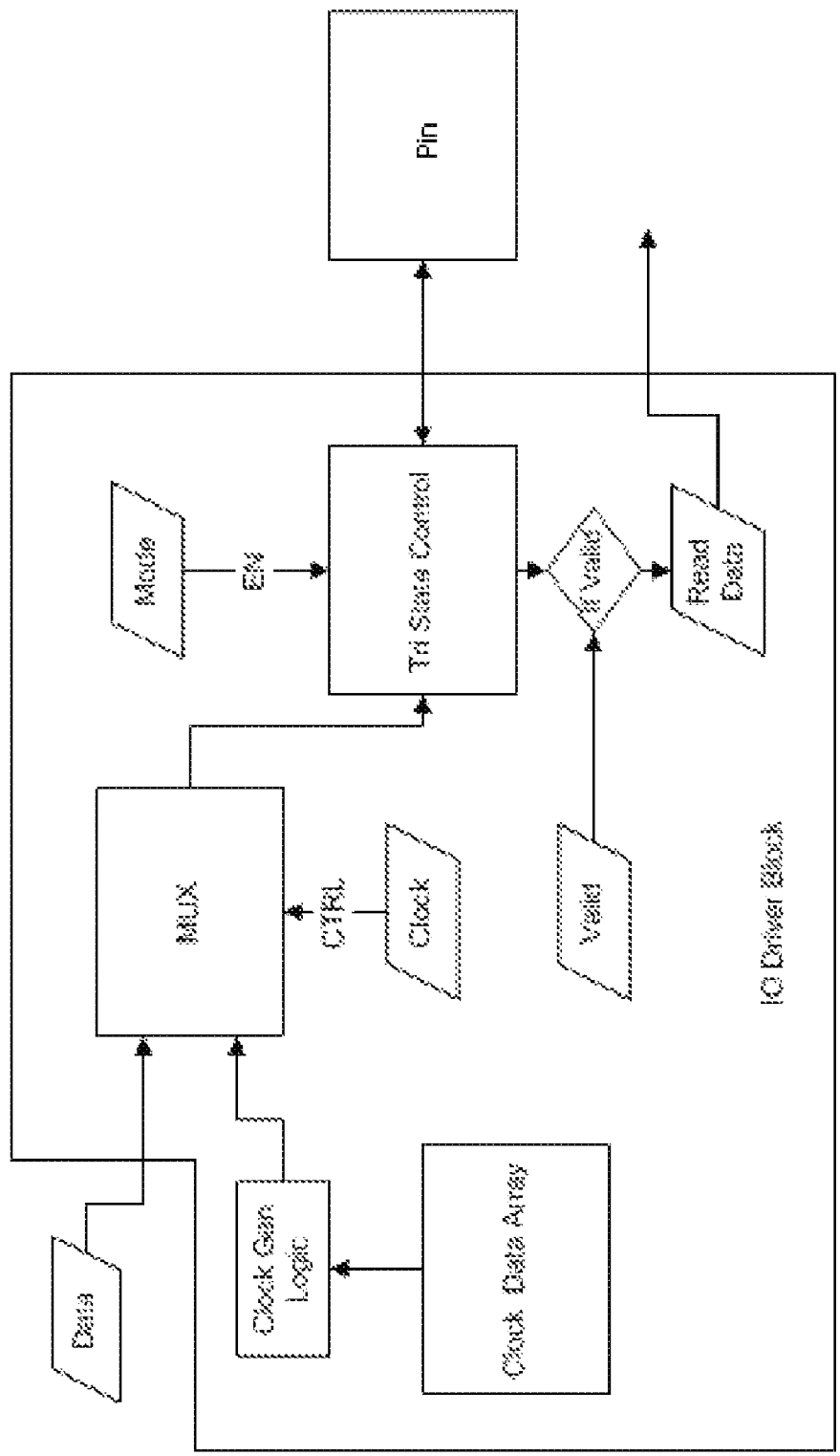
FIG. 4 is an information flow diagram of an 10 driver block of FIG. 3.

FIG. 4 is an information flow diagram of an IO driver block of FIG. 3, which is connected to a respective associated pin (input or output of the integrated circuitry 202). As shown in FIG. 4, a multiplexer of the IO driver block receives the pin's respective associated data from the position table (FIG. 3).

Also, the multiplexer receives signals from clock generation logic, which generates an oscillating clock signal in response to information that is stored by a clock data array. The clock generation logic generates the oscillating clock signal at a particular pattern that repeats automatically, in response to the code specified by the Clock field discussed hereinabove in connection with FIG. 2.

If the clock flag (shown by "CTRL" in FIG. 4) has a logic state "1" (indicating a "true" state), the multiplexer outputs the signals that the multiplexer receives from the clock generation logic. Conversely, if the clock flag has a logic state "0" (indicating a "false" state), the multiplexer outputs the data that the multiplexer receives from the position table. Notably, even if the clock flag has a logic state "0", the hardware acceleration emulator 204 is operable to generate an oscillating clock signal by varying the pin's respective associated data in the position table on a cycle-by-cycle basis.

As shown in FIG. 4, a tri-state control receives the output from the multiplexer. Also, the tri-state control receives the Mode field (described hereinabove in connection with FIG. 3), which identifies whether the pin is an input of the integrated circuitry 202, an output of the integrated circuitry 202, or instead high impedance. In that manner, the Mode field operates as an enable signal (shown by "EN" in FIG. 4) to the tri-state control.

If the Mode field identifies the pin as an input of the integrated circuitry 202, the tri-state control drives the pin with the output that the tri-state control receives from the multiplexer.

If the Mode field identifies the pin as an output of the integrated circuitry 202, the tri-state control reads the pin's value. As shown in FIG. 4, if the Valid field (described hereinabove in connection with FIG. 3) identifies the pin as valid, the IO driver block outputs the pin's value, so that the pin's value is compared by the data equality check of FIG. 3.

If the Mode field identifies the pin as high impedance, the tri-state control neither drives the pin nor reads its value.

Referring again to FIG. 1, the computer 104 and the computer-readable medium 114 are structurally and functionally interrelated with one another, as described further hereinbelow. In that regard, the computer-readable medium 114 is a representative one of the computer-readable media of the IHS 100 (including, but not limited to, the computer-readable medium 112). The computer-readable medium 114 stores (or encodes, or records, or embodies) functional descriptive material (including, but not limited to, software and data structures). Such functional descriptive material imparts functionality when encoded on the computer-readable medium 114. Also, such functional descriptive material is structurally and functionally interrelated to the computer-readable medium 114.

Within such functional descriptive material, data structures define structural and functional interrelationships between such data structures and the computer-readable medium 114 (and other aspects of the computer 104 and the IHS 100). Such interrelationships permit the data structures' functionality to be realized. Also, within such functional descriptive material, software (also referred to as computer programs or applications) defines structural and functional interrelationships between such software and the computer-readable medium 114 (and other aspects of the computer 104 and the IHS 100). Such interrelationships permit the software's functionality to be realized.

For example, the computer 104 reads (or accesses, or copies) such functional descriptive material from the computer-readable medium 114 into the memory device of the computer 104, and the computer 104 performs its operations (as described elsewhere herein) in response to such material, which is stored in the memory device of the computer 104. More particularly, the computer 104 performs the operation of processing software (which is stored, encoded, recorded or embodied on a computer-readable medium) for causing the computer 104 to perform additional operations (as described elsewhere herein). Accordingly, such functional descriptive material exhibits a functional interrelationship with the way in which the computer 104 executes its processes and performs its operations.

Further, the computer-readable media of the IHS 100 are apparatus from which the software is accessible by the computer 104, and the software is processable by the computer 104 for causing the computer 104 to perform such additional operations. In addition to reading such functional descriptive material from the computer-readable medium 114, the computer 104 is capable of reading such functional descriptive material from (or through) a network, which is also a computer-readable medium (or apparatus) of the IHS 100. Moreover, the memory device of the computer 104 is itself a computer-readable medium (or apparatus) of the IHS 100.

Although illustrative embodiments have been shown and described, a wide range of modification, change and substitution is contemplated in the foregoing disclosure and, in some instances, some features of the embodiments may be employed without a corresponding use of other features. Accordingly, it is appropriate that the appended claims be construed broadly and in a manner consistent with the scope of the embodiments disclosed herein.

What is claimed is:

1. A system, comprising:
    a general purpose computational resource for performing general purpose operations of the system; and
    a special purpose computational resource, coupled to the general purpose computational resource, for: storing test patterns, a description of an integrated circuit, and a description of hardware for testing the integrated circuit; and executing software for simulating an operation of testing of the integrated circuit in response to the test patterns,
    wherein the test patterns specify an expected value of the operation of testing of the integrated circuit;
    wherein the special purpose computational resource is for determining whether the expected value is different from a measured value of the operation of testing of the integrated circuit; and
    wherein the special purpose computational resource is for modifying the test patterns in response to a determination that the expected value is different from the measured value.

2. The system of claim 1, wherein the description of the integrated circuit and the description of hardware for testing the integrated circuit are register-transfer level descriptions.

3. The system of claim 1, wherein the special purpose computational resource is for receiving the test patterns and the description of the integrated circuit and the description of hardware for testing the integrated circuit from the general purpose computational resource.

4. The system of claim 1, wherein the special purpose computational resource is for outputting an error signal in response to a determination that the expected value is different from the measured value.

5. The system of claim 1, wherein the special purpose computational resource is for outputting the modified test patterns to the general purpose computational resource.

6. The system of claim 1, wherein the test patterns are coded in a programming language.

7. The system of claim 1, wherein the special purpose computational resource is for: compressing the test patterns for storage; and decompressing the test patterns for execution.

8. A method performed by an information handling system, the method comprising:
    with a general purpose computational resource of the information handling system, performing general purpose operations of the information handling system; and
    with a special purpose computational resource of the information handling system: storing test patterns, a description of an integrated circuit, and a description of hardware for testing the integrated circuit; executing software for simulating an operation of testing of the integrated circuit in response to the test patterns, wherein the test patterns specify an expected value of the operation of testing of the integrated circuit; determining whether the expected value is different from a measured value of the operation of testing of the integrated circuit; and modifying the test patterns in response to a determination that the expected value is different from the measured value.

9. The method of claim 8, wherein the description of the integrated circuit and the description of hardware for testing the integrated circuit are register-transfer level descriptions.

10. The method of claim 8, and comprising:
    with the special purpose computational resource, receiving the test patterns and the description of the integrated circuit and the description of hardware for testing the integrated circuit from the general purpose computational resource.

11. The method of claim 8, and comprising:
    with the special purpose computational resource, outputting an error signal in response to a determination that the expected value is different from the measured value.

12. The method of claim 8, and comprising:
    with the special purpose computational resource, outputting the modified test patterns to the general purpose computational resource.

13. The method of claim 8, wherein the test patterns are coded in a programming language.

14. The method of claim 8, and comprising:
    with the special purpose computational resource: compressing the test patterns for storage; and decompressing the test patterns for execution.

* * * * *